United States Patent
Ohashi et al.

(10) Patent No.: US 10,426,069 B2
(45) Date of Patent: Sep. 24, 2019

(54) FEEDER

(71) Applicant: FUJI CORPORATION, Chiryu-shi (JP)

(72) Inventors: Hiroyasu Ohashi, Nagoya (JP); Horoki Murase, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 23 days.

(21) Appl. No.: 15/556,666

(22) PCT Filed: Mar. 9, 2015

(86) PCT No.: PCT/JP2015/056850
§ 371 (c)(1),
(2) Date: Sep. 8, 2017

(87) PCT Pub. No.: WO2016/143040
PCT Pub. Date: Sep. 15, 2016

(65) Prior Publication Data
US 2018/0054928 A1   Feb. 22, 2018

(51) Int. Cl.
| H05K 13/02 | (2006.01) |
| H05K 13/04 | (2006.01) |
| G11B 15/00 | (2006.01) |
| B65H 35/00 | (2006.01) |

(52) U.S. Cl.
CPC ......... *H05K 13/02* (2013.01); *H05K 13/0417* (2013.01); *H05K 13/0419* (2018.08); *B65H 35/00* (2013.01); *G11B 15/00* (2013.01)

(58) Field of Classification Search
CPC ........... H05K 13/0417; H05K 13/0419; H05K 13/0408; B65H 35/00; G11B 15/00
See application file for complete search history.

(56) References Cited

U.S. PATENT DOCUMENTS 9,414,536 B2 * 8/2016 Yamasaki ............... H05K 13/02
2014/0367049 A1 * 12/2014 Higuchi ............... B65H 37/002
156/719

FOREIGN PATENT DOCUMENTS

| JP | 2011-77096 A | 4/2011 |
| JP | 2011-119388 A | 6/2011 |
| JP | 2015-19047 A | 1/2015 |
| WO | WO 2008/078647 A1 | 7/2008 |

OTHER PUBLICATIONS

International Search Report dated Apr. 21, 2015 in PCT/JP2015/056850 filed Mar. 9, 2015.

* cited by examiner

*Primary Examiner* — Anthony Calandra
*Assistant Examiner* — Caroline Montiel
(74) *Attorney, Agent, or Firm* — Oblon, McClelland, Maier & Neustadt, L.L.P.

(57) ABSTRACT

A feeder provided with: a feeder main body, on a rear section of which is formed a tape insertion section for inserting carrier tape that stores multiple components and on a front section of which is formed a tape discharge section for discharging the carrier tape from which components have been removed; a tape feeding path for feeding the carrier tape from rear to front, tape feeding path being provided on feeder main body between side walls and so as to connect to tape insertion section and tape discharge section; and a cover member provided on the feeder main body in an openable and closable manner so as to cover the tape feeding path between the rear-side sprockets and the front-side sprockets.

4 Claims, 11 Drawing Sheets

FIG. 11

FEEDER

TECHNICAL FIELD

The present application relates to a feeder for feeding carrier tape in which components are stored.

BACKGROUND ART

Disclosed in PTL 1 is a feeder that supplies components stored in carrier tape to a component mounting position without performing splicing work. This feeder is provided with a drive sprocket near the component pickup position on the front section of the feeder, a pushing sprocket provided adjacent to the drive sprocket, and an insertion sprocket on a carrier tape insertion section on the rear section of the feeder. The carrier tape is fed from the carrier tape insertion section to the component pickup position by these sprockets.

CITATION LIST

Patent Literature

PTL 1: JP-A-2011-77096

SUMMARY

Technical Problem

With the feeder of patent literature 1, in a case in which the state of the tape supplied from a reel is poor, for example, in a case in which the tape is curled, tape blockages may occur as the tape moves along the conveyance path inside the feeder main body. To clear this blockage, it is necessary to remove the feeder from the component mounter, disassemble the feeder main body, and remove the stuck tape, causing a problem of a decrease in production efficiency.

The present disclosure takes account of such problems and an object thereof is to provide a feeder for which it is easy to clear a tape blockage that occurs along the tape feeding path inside a feeder main body.

Solution to Problem

To solve the above problems, a feeder of the present disclosure includes: a feeder main body, on a rear section of which is formed a tape insertion section for inserting a carrier tape that stores multiple components, and on a front section of which is formed a tape discharge section for discharging the carrier tape from which the components have been removed; a tape feeding path for feeding the carrier tape from rear to front, the tape feeding path being provided on the feeder main body so as to connect to the tape insertion section; a rear-side sprocket rotatably provided on the feeder main body and including an engaging protrusion capable of engaging holes of the carrier tape inserted into the tape insertion section, the rear-side sprocket being configured to feed the carrier tape along the tape feeding path; a front-side sprocket rotatably provided on the feeder main body and including an engaging protrusion capable of engaging holes of the carrier tape fed by the rear-side sprocket, the front-side sprocket being configured to feed the carrier tape to the tape discharge section; and a cover member provided on the feeder main body in an openable and closable manner so as to cover the tape feeding path between the rear-side sprocket and the front-side sprocket.

Because a cover member is provided between the rear-side sprocket and the front-side sprocket of the feeder main body in a manner capable of revealing the tape feeding path, if a tape blockage occurs along the tape feeding path, an operator can easily clear the tape blockage by opening the cover member. By this, unlike with conventional technology, it is not necessary for an operator to remove the feeder from the component mounter and disassemble the feeder main body, thus lowering of production efficiency is curtailed.

DESCRIPTION OF EMBODIMENTS

Configuration of Component Mounter

Figure 1:
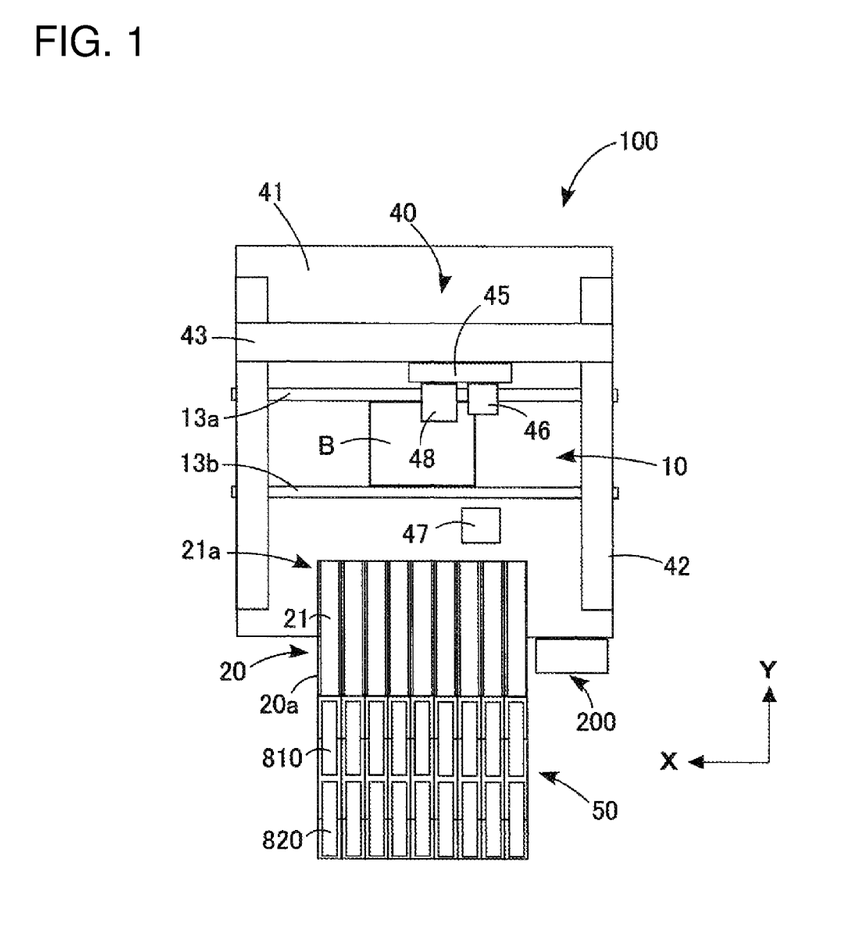
FIG. 1 is an overall plan view of a component mounter that is a suitable embodiment of the disclosure.

An embodiment of the present disclosure is described below with reference to the figures. FIG. 1 shows component mounter 100 provided with feeders 21; component mounter 100 includes board conveyance section 10, component supply section 20, component mounting section 40, reel holding section 50, and control device 200 that controls those items. In the following description, the X-axis direction refers to the conveyance direction of boards, and the Y-axis direction refers to the horizontal direction orthogonal to the X-axis direction.

As shown in FIG. 1, component supply section 20 is formed from multiple slots 20a and multiple feeders 21 which are detachably mounted to each of the slots 20a. Slots 20a are provided in component supply section 20 lined up in parallel in the X-axis direction. First reel 810 and second reel 820 on which carrier tapes 900 (refer to FIG. 2) are wound are exchangeably held on reel holding section 50. First reel 810 and second reel 820 are arranged adjacent to each other in the Y direction, and multiple of the reels are arranged in the X direction corresponding to each of the feeders 21.

Details are described later, but carrier tapes 900 wound on first reel 810 and second reel 820 are able to be inserted into each feeder 21. The carrier tape 900 wound on one of the reels, reel 810 (reel 820), is sequentially indexed by feeder 21 to component pickup position 21a provided at the tip section of feeder 21. By this, a component held in the carrier tape 900 is positioned at component pickup position 21a.

Further, carrier tape 900 which is wound on the other reel, reel 820 (reel 810), stands by without being supplied by feeder 21.

Note that, below, to facilitate description, in order to distinguish between carrier tape 900 which is being indexed (in use) and carrier tape which is standing by, there are cases in which the former is referred to as a first carrier tape 900A and the latter is referred to as a second carrier tape 900B. In these cases, since the second carrier tape becomes the first carrier tape after all of the components which are stored in the first carrier tape are used, the terms first carrier tape and second carrier tape do not indicate a specific carrier tape.

Figure 2:
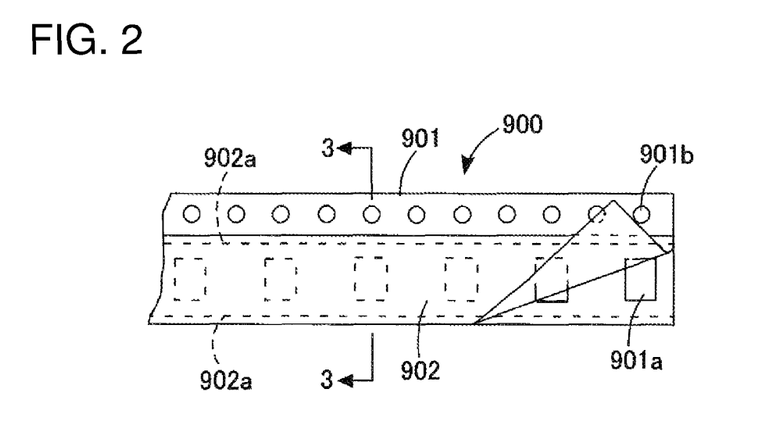
FIG. 2 is a plan view of carrier tape.
Figure 3:
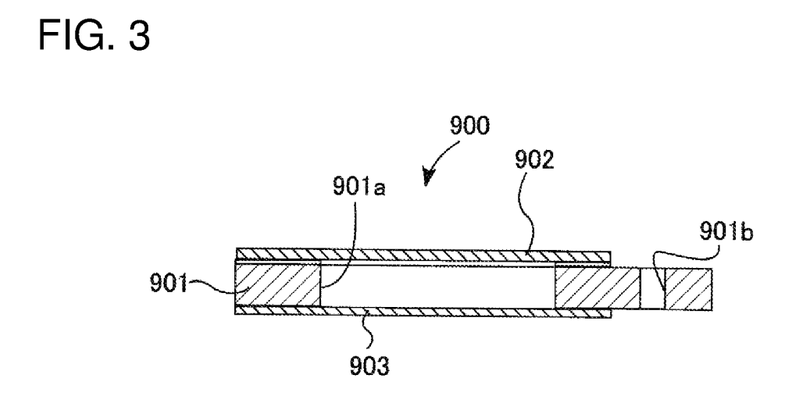
FIG. 3 is a cross section of the carrier tape shown in FIG. 2 at line 3-3.

As shown in FIGS. 2 and 3, multiple components, for example electronic components, are stored in a row in carrier tape 900. Carrier tape 900 is configured from base tape 901, cover tape 902, and bottom tape 903. Base tape 901 is formed of a flexible material such as a paper material or a resin. Storage sections 901a, which are cavities, are formed as through-holes in a center portion of base tape 901 in the width direction at a fixed interval in the length direction. Components are stored in storage sections 901a. Engagement holes 901b are formed as through-holes in a side portion of the base tape 901 at a fixed interval in the length direction.

As shown in FIG. 2, both side portions of cover tape 902 are adhered to both side portions of the top surface of base tape 901 using an adhesive 902a, and usually cover tape 902 covers the upper section of storage sections 901a. Components stored in storage sections 901a are prevented from coming out by cover tape 902. Cover tape 902 is formed from a transparent polymer film. As shown in FIG. 3, bottom tape 903 is adhered to the bottom surface of base tape 901. Components stored in storage sections 901a are prevented from falling out by bottom tape 903. Bottom tape 903 is formed of a transparent or semi-transparent paper or polymer film or the like.

As shown in FIG. 1, in board conveyance section 10, a pair of guide rails 13a and 13b are provided on base 41 of component mounting device 40. Also, conveyor belts, not shown, that support and convey a printed circuit board B that is guided by both of the guide rails 13a and 13b, and a clamp device, not shown, that raises board B that has been conveyed to a specified position, are provided in board conveyance section 10. Board B on which components are to be mounted is conveyed in the X-axis direction to a component mounting position by the conveyor belts while being guided by guide rails 13a and 13b of board conveyance section 10. Printed circuit board B that is conveyed to the component mounting position is positioned and clamped in the component mounting position by the clamp device.

Component mounting section 40 includes guide rail 42, Y-axis slide 43, X-axis slide 45, and component mounting head 48 that holds a suction nozzle, which is not shown. The movement of Y-axis slide 43 and X-axis slide 45 in the Y-axis direction and the X-axis direction is controlled by a Y-axis servo motor and an X-axis servo motor which are omitted from the drawings. A Y-axis robot is formed by guide rail 42 and Y-axis slide 43. Guide rail 42 is mounted in the Y-axis direction above base 41 and is arranged to be above board conveyance section 10. Y-axis slide 43 is provided to be capable of moving in the Y-axis direction along guide rail 42. Y-axis slide 43 is moved in the Y-axis direction via a ball screw mechanism by the Y-axis servo motor, which is omitted from the drawings.

An X-axis robot is formed by X-axis slide 45. X-axis slide 45 is provided to be capable of moving in the X-axis direction on Y-axis slide 43. An X-axis servo motor, not shown, is provided on Y-axis slide 43. X-axis slide 45 is moved in the X-axis direction via a ball screw mechanism by the X-axis servo motor. Component mounting head 48 is provided on X-axis slide 45. Component mounting head 48 holds multiple suction nozzles (not illustrated in the drawings) in a detachable manner. Each suction nozzle picks up a component fed to component supply position 21a and mounts the component on board B, which is positioned at the component mounting position by board conveyance section 10.

Board camera 46 is attached to X-axis slide 45. Board camera 46 images fiducial marks that are provided on board B positioned at the board mounting position, or a component or the like that is supplied to component supply position 21a, from above, and acquires board position fiducial information, component position information, and the like. Component camera 47 capable of imaging a component that has been picked up by the suction nozzle from beneath is provided on base 41.

Control device 200 controls feeder 21 and controls the rotation of first servo motor 22 and second servo motor 23 of feeders 21, described below. Control device 200 includes a microprocessor and a driver that supplies the drive currents to servo motors 22 and 23. When feeder 21 is inserted into slot 20a of component supply section 20, electric power is supplied to feeder 21 from the main body side of component mounter 100 via a communication connector, not shown, and required information such as the feeder ID is sent from feeder 21 to control device 200 of component mounter 100. By this, information of the component fed by carrier tape 900 mounted in feeder 21 is acquired based on the serial ID of feeder 21 and stored in control device 200.

Configuration of Feeder

Figure 4:
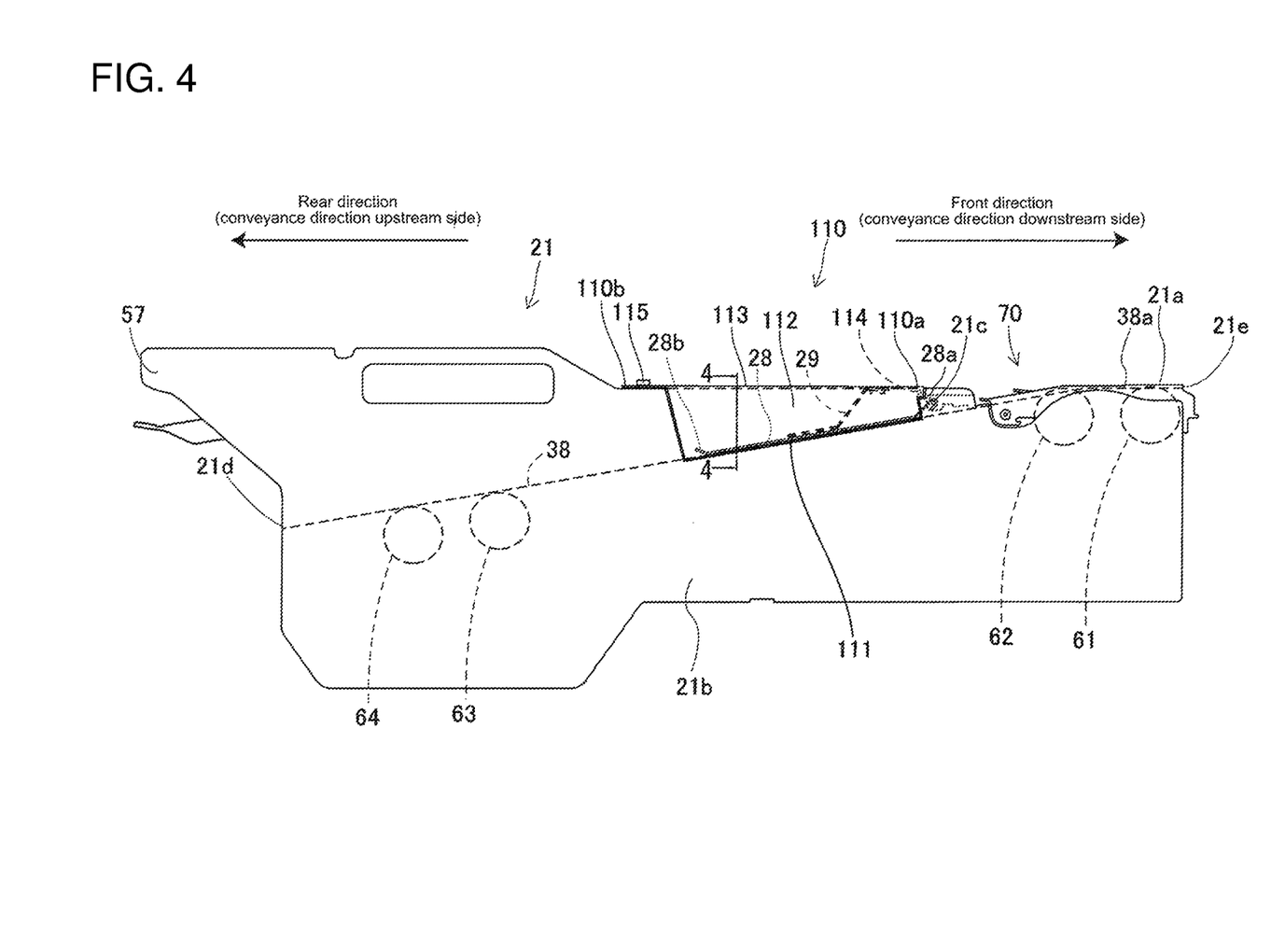
FIG. 4 is a side view of a feeder of an embodiment of the disclosure.

Next, the configuration of feeder 21 is described with reference to FIGS. 4 to 8. As shown in FIGS. 4 and 7, feeder 21 is configured mainly from feeder main body 21b, rail 38 as a tape feeding path, first sprocket 61 and second sprocket 62 as front-side sprockets, third sprocket 63 and fourth sprocket 64 as rear-side sprockets, upper surface retaining member 28, and cover member 110. Note that, FIG. 7 is a diagram showing side wall 21ba (the rear side in FIG. 7) of feeder main body 21b, with the other side wall 21bb (front side of FIG. 7) being omitted in order to show the internal structure of feeder 21.

Feeder main body 21b is a flat box shape. Tape insertion section 21d for inserting carrier tape 900 is formed at a rear section on feeder main body 21b, and tape discharge section 21e for discharging carrier tape 900 is formed at a front section of feeder main body 21b. Tape insertion section 21d is formed as an entrance to tape feeding path 38 that has a width the same as the width of tape feeding path (rail) 38; tape discharge section 21e is formed as an entrance of tape feeding path 38 that has a width the same as the width of tape feeding path 38.

Tape feeding path 38 is provided on feeder main body 21b connected to tape insertion section 21d and tape discharge section 21e and is for conveying carrier tape 900 from the rear to the front of feeder main body 21b. Front section 38a of tape feeding path 38 is formed to be horizontal. In the present embodiment, tape feeding path 38 is inclined to gradually increase in height from the rear section to before front section 38a. Note that, although not shown, guide sections that are separated by a dimension which is slightly greater than the width dimension of carrier tape 900 are provided on both sides of tape feeding path 38.

First sprocket 61 and second sprocket 62 are provided to be capable of rotating from the front toward the rear (from the downstream side to the upstream side in the feeding direction) in feeder main body 21*b* beneath front section 38*a* of tape feeding path 38, that is, in positions adjacent to component pickup position 21*a* of feeder main body 21*b*. Third sprocket 63 and fourth sprocket 64 are provided to be capable of rotating from the front toward the rear in feeder main body 21*b* beneath the rear section of tape feeding path 38.

As shown in FIG. 7, engaging protrusions 61*a*, 62*a*, and 63*a* are formed at a fixed angle all the way around the outer circumferences of first sprocket 61, second sprocket 62, and third sprocket 63, respectively. Fourth engaging protrusions 64*a* are formed at an interval of 180 degrees on a portion of the outer circumference of fourth sprocket 64. That is, between each engaging protrusion 64*a* of fourth sprocket 64, there is a portion where no engaging protrusions are formed. Each of the engaging protrusions 61*a* to 64*a* is able to engage with engagement holes 901*b* of carrier tape 900.

First sprocket gear 61*b*, second sprocket gear 62*b*, third sprocket gear 63*b*, and fourth sprocket gear 64*b* are respectively formed closer to the inside than the outer circumference of the first sprocket 61 to the fourth sprocket 64. A window, not shown in the drawings, is provided in tape feeding path 38 above each sprocket 61 to 64, and each engaging protrusion 61*a* to 64*a* penetrates through tape feeding path 38 through this window.

First servo motor 22 rotates first sprocket 61 and second sprocket 62. First drive gear 22*b* is provided on rotating shaft 22*a* of first servo motor 22. First gear 24 is rotatably provided on main body 21*b* beneath first sprocket 61 and second sprocket 62. First outside gear 24*a* that meshes with first drive gear 22*b* is formed on the outer circumference of first gear 24. First inside gear 24*b* is formed closer to the inside than the outer circumference of first gear 24.

Second gear 25 is rotatably provided on main body 21*b* between first sprocket 61 and second sprocket 62, and first gear 24. Second gear 25 meshes with first sprocket gear 61*b*, second sprocket gear 62*b*, and first inside gear 24*b*. According to such a configuration, the rotation speed of first servo motor 22 is reduced and transmitted to first sprocket 61 and second sprocket 62, and, first sprocket 61 and second sprocket 62 rotate in synchronization.

Second servo motor 23 rotates third sprocket 63 and fourth sprocket 64. Second drive gear 23*b* is provided on rotating shaft 23*a* of second servo motor 23. Third gear 26 is rotatably provided on main body 21*b* beneath third sprocket 63 and fourth sprocket 64. Third outside gear 26*a* that meshes with second drive gear 23*b* is formed on the outer circumference of third gear 26. Third inside gear 26*b* is formed closer to the inside than the outer circumference of third gear 26.

Fourth gear 27 is rotatably provided on main body 21*b* between third sprocket 63 and fourth sprocket 64, and third gear 26. Fourth gear 27 meshes with third sprocket gear 63*b*, fourth sprocket gear 64*b*, and third inside gear 26*b*. According to such a configuration, the rotation speed of second servo motor 23 is reduced and transmitted to third sprocket 63 and fourth sprocket 64, and, third sprocket 63 and fourth sprocket 64 rotate in synchronization.

As shown in FIG. 4, upper surface retaining member 28 is provided along the top of tape feeding path 38 between third sprocket 63 and second sprocket 62. Shaft support portion 28*a* is formed on the front end of upper surface retaining member 28, and shaft support portion 28*a* is axially supported on shaft portion 21*c* that is provided in main body 21*b*, and, upper surface retaining member 28 is attached to main body 21*b* to be capable of rocking. Guide section 28*b*, which is bent upward, is formed on the rear end of upper surface retaining member 28. Upper surface retaining member 28 is biased downwards by biasing member 29 formed from a torsion spring that is described later, in order to push down on the upper surface of carrier tape 900 being fed on tape feeding path 38 and prevent the carrier tape 900 from raising.

As shown in FIG. 4, cover member 110 is provided between second sprocket 62 and third sprocket 63 in a manner capable of revealing tape feeding path 38. That is, cover member 110 is provided such that the portion of tape feeding path 38 at which upper surface retaining member 28 is arranged can be revealed. Also, in the embodiment, the configuration is such that only one side of feeder main 21*b*, side wall 21*bb* (the right side in FIG. 5), is openable, with the portion of side wall 21*bb* at which cover member 110 is provided having a cutout formed to match cover member 110. For the portion at which cover member 110 is formed, side wall 21*ba* of feeder main body (the left side in FIG. 5) is formed to protrude below tape feeding path 38, and side wall 21*bb* is formed to be lower than side wall 21*ba*.

Figure 5:
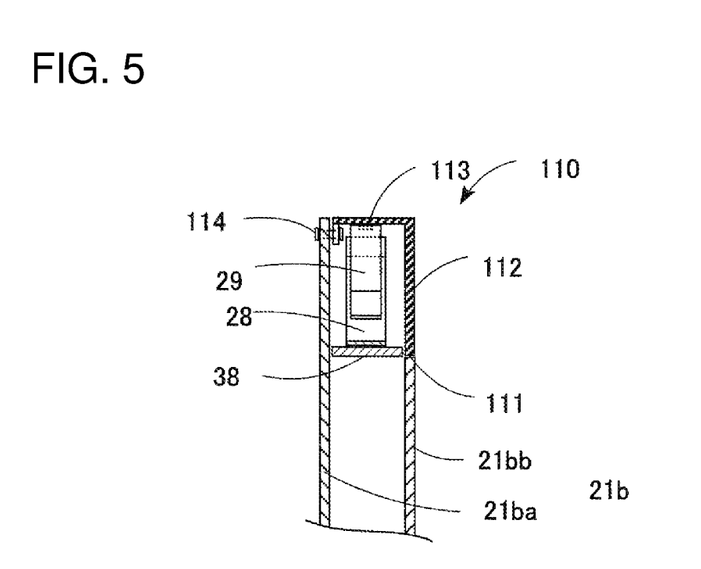
FIG. 5 is a cross section of the feeder shown in FIG. 4 at line 4-4.

Specifically, as shown in FIG. 4, cover member 110 is formed in a trapezoid shape as seen from the side, and, as shown in FIG. 5, is formed in an L-shape as viewed along line 4-4. That is, as shown in FIG. 4, lower edge section 11 of cover member 110 as seen from the side is formed along tape feeding path 38. And, as shown in FIG. 5, side surface 112 of cover member 110 is formed to cover the side wall 21*bb* side, and upper surface 113 of cover member 110 is formed to cover an upper section of tape feeding path 38.

Further, as shown in FIG. 4, an end of cover member 110 in the feeding direction, front side end 110*a* in the present embodiment, is rotatably supported on axis section 114 provided on side wall 21*ba*, and rear end section 110*b* of cover member 110 is locked on feeder main body 21*b* in a releasable manner by locking member 115 provided on the rear end section.

Figure 6:
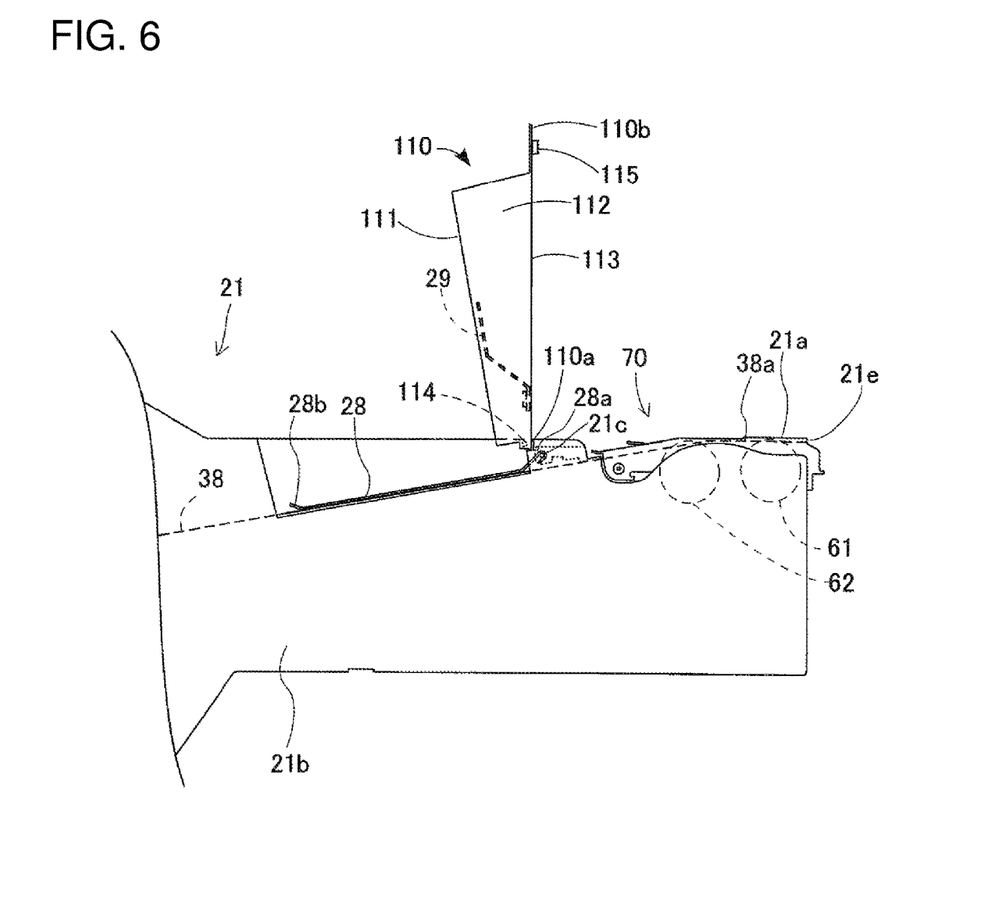
FIG. 6 is a side view showing a state with a cover member of the feeder open.
Figure 7:
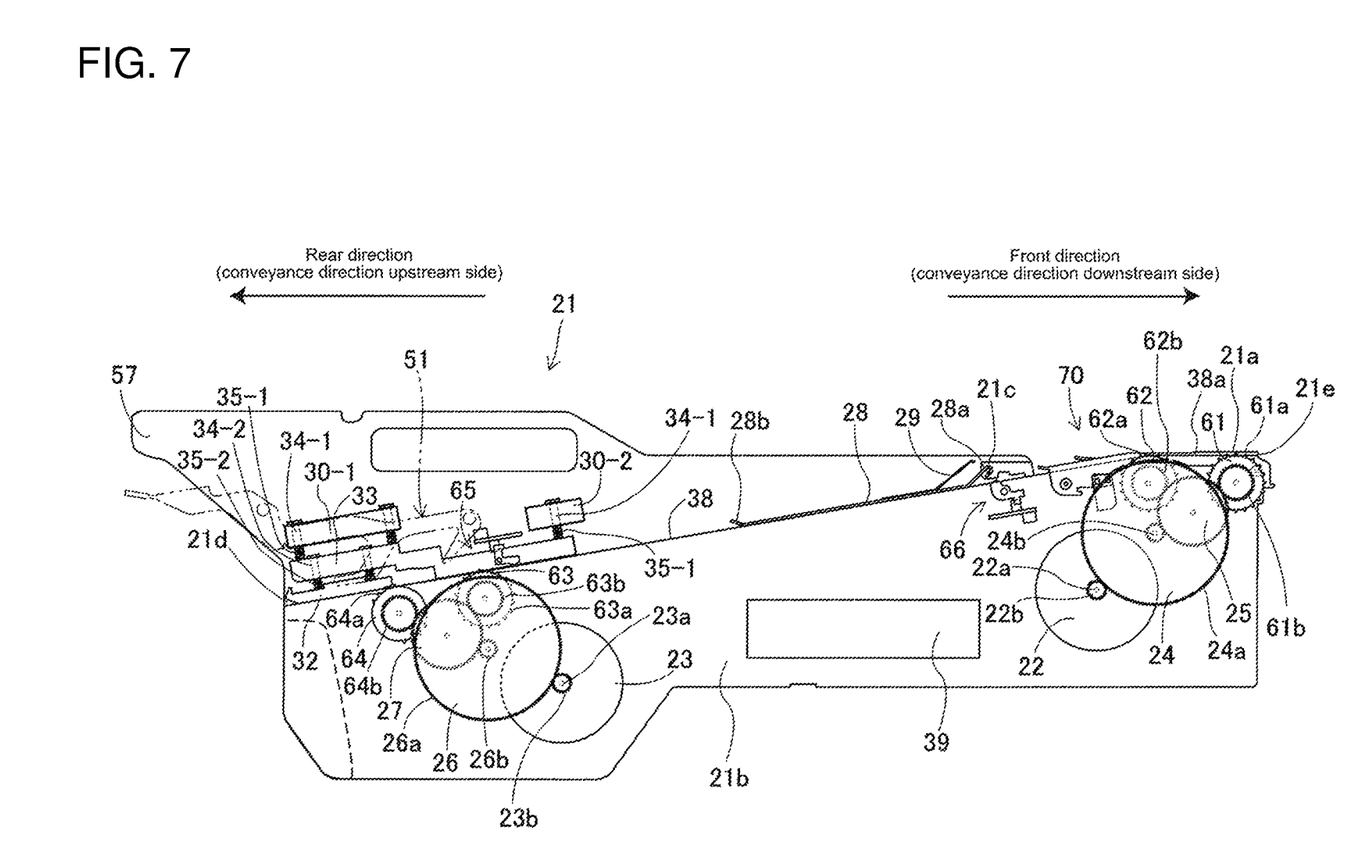
FIG. 7 is a cutaway side view of the feeder.

By this, by an operator releasing locking member 115 and rotating cover member 110 upwards around axis section 114 at the center, the state is switched from a state shown in FIG. 4 in which upper surface retaining member 28 is covering tape feeding path 38, and a state shown in FIG. 6 in which tape feeding path 38 is revealed (an open state).

Also, as shown in FIG. 4, when cover member 110 is in a closed state, the rear end of biasing member 29 contacts an upper surface of upper surface retaining member 28, and, as shown in FIG. 6, when cover member 110 is in an open state, the front end of biasing member 29 is attached to the ceiling of cover member 110 such that the rear end of biasing member 29 separates from the upper surface of upper surface retaining member.

By this, an operator can, as shown in FIG. 6, separate biasing member 29 from the upper surface of upper surface retaining member 28 by changing cover member 110 from the closed state to the open state. Thus, it is possible to raise upper surface retaining member 28 and clear a tape blockage, and to insert carrier tape 900 and engage the carrier tape 900 with second sprocket 62 even when the carrier tape 900 is of a length that cannot be fed from the reel. Also, because an operator can, as shown in FIG. 4, make biasing member 29 contact the upper surface of retaining member 28 by changing cover member 110 from the closed state to the open state with feeder 21 still mounted in slot 20*a*, operation of feeder 21 can be started immediately.

Figure 8:
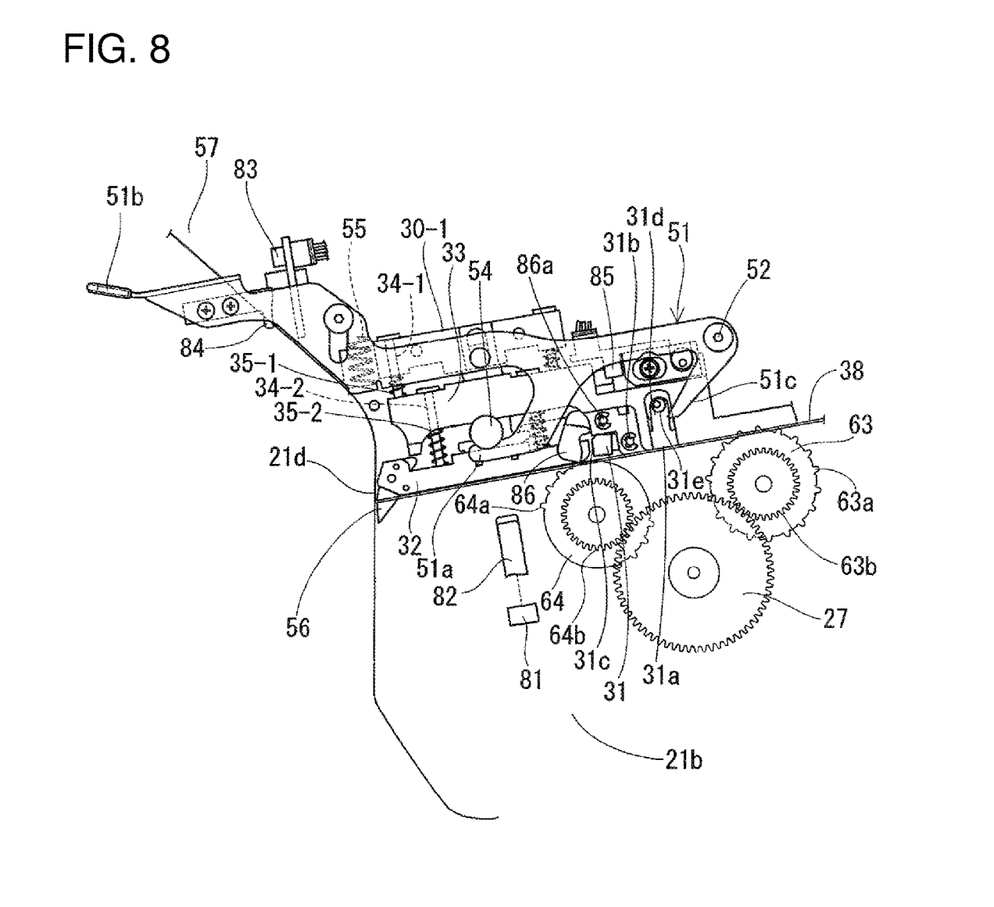
FIG. 8 shows an enlarged detailed view of the third and fourth sprockets of the feeder and surrounding items.

As shown in FIGS. 7 and 8, entrance retaining member 32 pushes carrier tape 900 inserted into tape insertion section 21*d* towards tape feeding path 38, is arranged along the upper surface of the rear section of tape feeding path 38 close to tape insertion section 21d, and is detachable from tape feeding path 38. Entrance retaining member 32 is attached so as to be movable in a vertical direction via pair of shafts 34-2 downwards from the rear section of downstream-side retaining member 33. Springs 35-2 that bias entrance retaining member 32 downward are attached to pair of shafts 34-2.

Downstream-side retaining member 33 pushes on carrier tape 900 at the downstream side to entrance retaining member 32, and is detachable from tape retaining path 38. Downstream-side retaining member 33 is attached to first support member 30-1 and second support member 30-2, which are attached to main body 21b, via shaft 34-1 so as to be capable of moving in the vertical direction. Spring 35-1 that biases downstream-side retaining member 33 downward is attached to shaft 34-1.

Operation lever 51 is rotatably supported around pivot 52 on the rear section of feeder main body 21b so as to protrude to the rear and higher than tape insertion section 21d. Lever operation grip section 57 (refer to FIG. 4) is formed higher than operation lever 51 to protrude to the rear from the rear section of feeder main body 21b. Operation lever 51 is formed such that the pivot 52 side is stored in lever operation grip section 57 and the operation knob 51b side protrudes from level operation grip section 57, such that an operator can easily grip lever operation grip section 57 in the palm of their hand and operate operation knob 51b with a finger.

As described later, entrance retaining member 32 is operationally connected to operation lever 51. Engaging member 54 is provided on entrance retaining member 32 between pair of shafts 34-2. Operation engaging section 51a that engages with the lower surface of engaging member 54 of entrance retaining member 32 is formed in the central section of operation lever 51. Operation lever 51 is rotated in a counterclockwise direction in FIG. 8 by the biasing force of spring 55, and usually operation engaging section 51a is held at a lower position, with entrance retaining member 32 contacting tape feeding path 38 due to the biasing force of springs 35-2. Thus, usually, carrier tape 900 is unable to be inserted into tape insertion section 21d due to entrance retaining member 32.

However, when operation knob 51b provided an the rear end of operation lever 51 is raised by an operator, operation lever 51 is rotated against the biasing force of spring 55, such that entrance retaining member 32 is raised against the biasing force of springs 35-2 via operation engaging section 51a. By this, entrance retaining member 32 is raised up and separated from tape feeding path 38, such that carrier tape 900 is able to be inserted into tape insertion section 21d.

Figure 9:
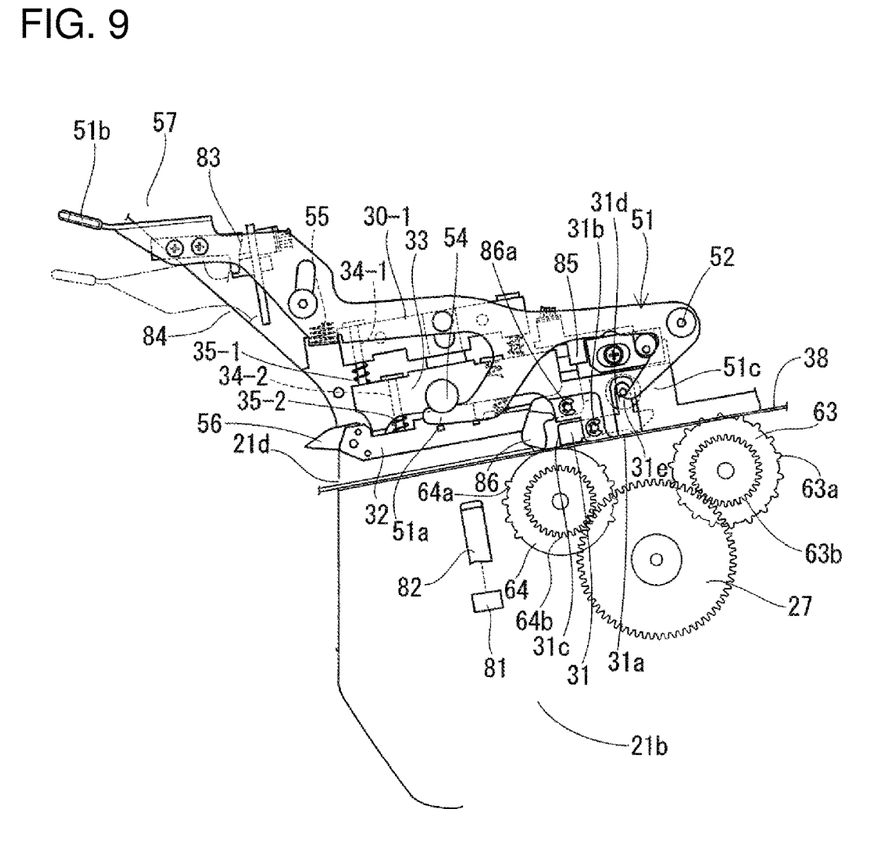
FIG. 9 shows an operating state of FIG. 8 in which the operation lever is in a raised state.

Obstructing plate 56 that covers tape entrance section 21d is hinged on the rear section of entrance retaining member 32. Obstructing plate 56 prevents carrier tape 900 from being able to be inserted between tape feeding path 38 and entrance retaining member 32. Note that, when entrance retaining member 32 is raised, as shown in FIG. 9, obstructing plate 56 engages with the rear section of downstream-side retaining member 33 and rotates to open tape entrance section 21d.

Stopper member 31 is provided adjacent to and contacting the downstream side of entrance retaining member 32. Stopper member 31 is able to rotate by shaft support section 31b provided in the central portion of stopper member 31 being supported by downstream-side retaining member 33. Abutting section 31a is formed protruding downward on the bottom portion of stopper member 31 closer to the front than shaft support portion 31b. The rear end of stopper member 31 is stopping section 31c.

A spring 36, not shown, that biases abutting section 31a to contact tape feeding path 38 is attached between downstream-side retaining member 33 and stopper member 31. Protruding section 31d that protrudes up is formed on the upper section of stopper member 31 further to the front than shaft support section 31b, and cam follower 31e is provided on the end of protruding section 31d. Cam section 51c formed in the front section of operation lever 51 is able to engage with and separate from cam follower 31e.

Operation lever 51 is rotated in the counterclockwise direction shown in FIG. 8 by the biasing force of spring 55 and, in a state in which entrance retaining member 32 contacts tape feeding path 38, cam section 51c formed on operation lever 51 is separated from cam follower 31e of stopper member 31. By this, stopper member 31 is rotated clockwise as in FIG. 8 around shaft support section 31b by the biasing force of a spring, such that abutting section 31a contacts tape feeding path 38 and stopping section 31c is held at a position separated from tape feeding path 38.

On the other hand, when operation lever 51 is rotated against the biasing force of spring 55, cam section 51c formed on operation lever 51 engages with cam follower 31e of stopper member 31 so as to rotate stopper member 31 in a counterclockwise direction as in FIG. 7 against the biasing force of a spring, not shown, such that stopping section 31c contacts tape feeding path 38. By this, in a state with operation lever 51 rotated against the biasing force of spring 55, when first carrier tape 900A is inserted into tape insertion section 21d, the leading end of first carrier tape 900A contacts stopping section 31c of stopper member 31 so as to be stopped at a specified position.

Note that, when first carrier tape 900A passes between abutting section 31a of stopper member 31 and tape feeding path 38, abutting section 31a is raised by first carrier tape 900A and stopping section 31c of stopper member 31 contacts tape feeding path 38. Thus, in this state, when second carrier tape 900B is inserted by an operator into tape insertion section 21d on top of first carrier tape 900A, the leading end of second carrier tape 900B is stopped by contacting stopping section 31c of stopper member 31. By this, feeding downstream of second carrier tape 900B is prevented and second carrier tape 900B stands by at that position.

As shown in FIG. 8, first sensor 81 that detects when first carrier tape 900A is inserted into tape insertion section 21d is attached to feeder main body 21b. First sensor 81 turns on by first dog 82 that protrudes from the lower surface of tape feeding path 38 being lowered by the insertion of first carrier tape 900A. First dog 82 is usually held in a position protruding from the lower surface of tape feeding path 38 by the biasing force of a spring, not shown, and is pressed down when first carrier tape 900A is inserted.

Further, second sensor 83 that detects that operation lever 51 has been rotated, and third sensor 85 that operates when second carrier tape 900B is fed on tape feeding path 38 above fourth sprocket 64, are attached to feeder main body 21b. Second sensor 83 is turned on by second dog 84 attached to operation lever 51. Third sensor 85 is turned on by the rotation of third dog 86.

Third dog 86 is able to rotate by shaft support section 86a provided in the central portion of third dog 86 being supported by downstream-side retaining member 33. Third dog 86 is usually biased in a counterclockwise direction as in FIG. 8 by a spring, which is not shown. By this, the leading end of third dog 86 contacts the upper surface of tape feeding path 38 when there is no carrier tape 900 on tape feeding path 38, and the leading end of third dog 86 contacts the upper surface of first carrier tape 900A when there is a first carrier tape 900A on tape feeding path 38.

As shown in FIG. 7, fourth sensor 65 that detects the presence or absence of carrier tape 900 and outputs that detection signal to control section 39 is provided in main body 21b on the downstream side of third sprocket 63 (the rear end side of feeder 21). Fourth sensor 65 is a sensor that detects a boundary portion between first carrier tape 900A and second carrier tape 900B. Fifth sensor 66 that detects the presence or absence of carrier tape 900 and outputs that detection signal to control section 39 is provided in main body 21b on the upstream side of second sprocket 62 (the front end side of feeder 21).

Tape peeling device 70 is provided on an upper front section of feeder main body 21b, and peels cover tape 902 from carrier tape 900 such that a component is able to be removed from storage section 901a positioned at component pickup position 21a.

Feeder Operation

Operation of feeder 21 of the above embodiment is described next with reference to FIGS. 8 to 11. Here, first carrier tape 900A is wound around front-side reel 810, and second carrier tape 900B is wound around rear-side reel 820. Normally, operation lever 51 is held in the position shown in FIG. 8 by the biasing force of spring 55, entrance retaining member 32 contacts tape feeding path 38, and obstructing plate 56 rotates under its own weight to cover tape entrance section 21d.

In this state, as shown in FIG. 9, operation knob 51b of operation lever 51 is raised by an operator. When operation lever 51 is raised, second sensor 83 is operated by second dog 84 to detect operation of operation lever 51. Entrance retaining member 32 is raised by the rotation of operation lever 51 via operation engaging section 51a.

By this, entrance retaining member 32 is separated from tape feeding path 38, and obstructing plate 56 is rotated by downstream-side retaining member 33. As a result, tape insertion section 21d is opened, and carrier tape 900 is able to be inserted. At the same time, by the rotation of operation lever 51, stopper member 31 is rotated by cam section 51c, and stopping section 31c contacts tape feeding path 38.

In this state, the leading end of first carrier tape 900A is inserted by an operator along tape feeding path 38 via tape insertion section 21d to the specified position contacting stopping section 31c of stopper member 31. By this, because first dog 82 and third dog 86 are operated by first carrier tape 900A, first sensor 81 and third sensor 85 are activated such that it is detected that first carrier tape 900A has been inserted to the specified position.

When first carrier tape 900A is inserted to a position contacting stopping section 31c, operation of operation lever 51 is released, and operation lever 51 rotates, returning to its original position as shown by a two-dot chain line in FIG. 9 due to the biasing force of spring 55. By the return of operation lever 51, entrance retaining member 32 is lowered towards tape feeding path 38, and the inserted first carrier tape 900A is pressed towards tape feeding path 38.

Figure 10:
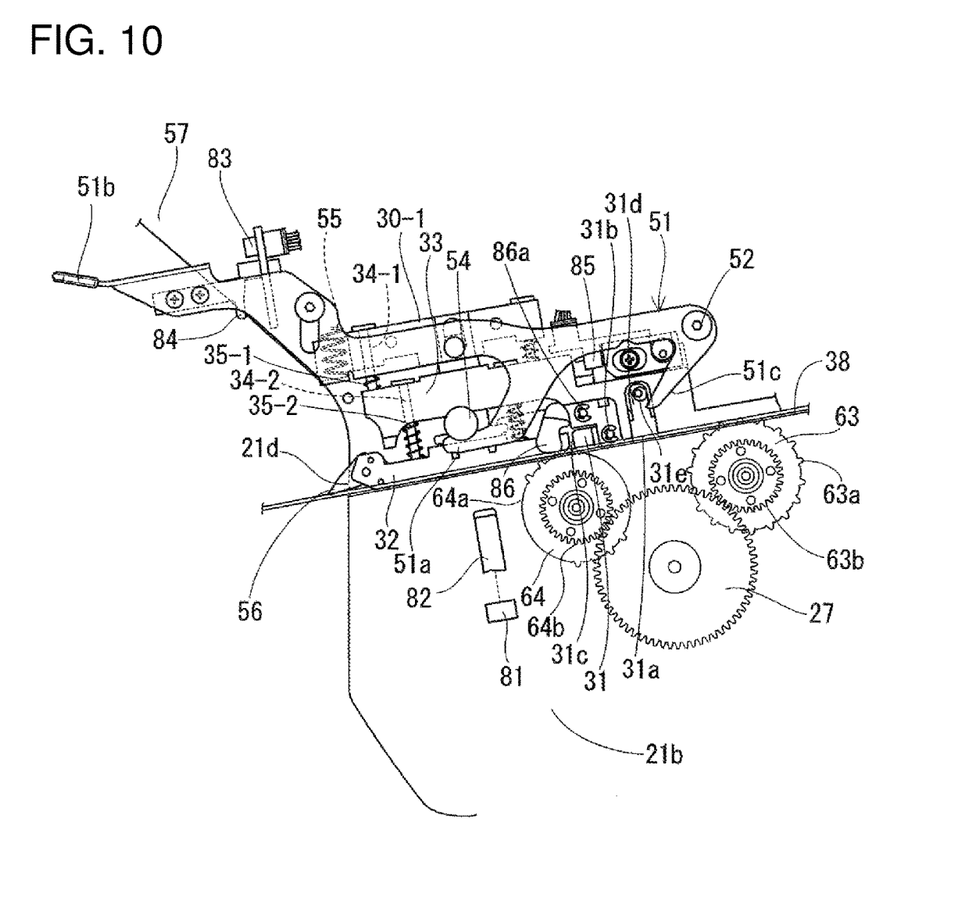
FIG. 10 shows an operating state of FIG. 8 in which the carrier tape is being fed.

As shown in FIG. 10, when the insertion of first carrier tape 900A is detected and the return of operation lever 51 to its original position is detected (second sensor 83 is off), second servo motor 23 is driven such that third and fourth sprockets 63 and 64 rotate. By this, engaging protrusion 64a of fourth sprocket 64 engages with engaging hole 901b of first carrier tape 900A, and first carrier tape 900A is fed by fourth sprocket 64 to the third sprocket 63 side.

Due to the feeding of first carrier tape 900A by fourth sprocket 64, downstream-side retaining member 33 is raised by first carrier tape 900A against the biasing force of spring 35-1, and first carrier tape 900A is fed between downstream-side retaining member 33 and tape feeding path 38.

In this case, because engaging protrusions 64a of fourth sprocket 64 are only formed in a portion of the outer circumference of fourth sprocket 64, when engaging protrusions 64a engage with engaging hole 901b of first carrier tape 900A, first carrier tape 900A is moved intermittently to the third sprocket 63 side. As a result, first carrier tape 900A is not suddenly taken up to the third sprocket 63 side. Note that, when downstream-side retaining member 33 is raised by first carrier tape 900A, shaft support sections 31b and 86a of stopper member 31 and third dog 86 are raised as one body.

When engaging holes 901b formed in first carrier tape 900A fed by fourth sprocket 64 engage with engaging protrusions 63a of third sprocket 63, first carrier tape 900A is fed to the second sprocket 62 side by third sprocket 63. Because engaging protrusions 63a are formed along the entire circumference of the outer circumference of third sprocket 63, first carrier tape 900A is fed to the second sprocket 62 side in a short time.

Further, the leading end of first carrier tape 900A enters beneath upper surface retaining member 28 from between guide section 28b and tape feeding path 38. The leading end of first carrier tape 900A is suppressed from lifting up from tape feeding path 38 by upper surface retaining member 28 and is fed to second sprocket 62. When fifth sensor 66 detects the leading end of first carrier tape 900A conveyed thereto by third sprocket 63, first servo motor 22 and second servo motor 23 intermittently rotate sprockets 61 to 64 by the component pitch.

When engaging holes 901b formed in first carrier tape 900A engage with engaging protrusions 62a of second sprocket 62, first carrier tape 900A is fed to tape peeling device 70 by second sprocket 62 and cover tape 902 is peeled from first carrier tape 900A by tape peeling device 70. Then, when engagement holes 901b formed in first carrier tape 900A engage with engaging protrusions 61a of first sprocket 61, components stored in first carrier tape 900A are sequentially positioned at component pickup position 21a by first sprocket 61.

When first carrier tape 900A is fed by feeder 21, as shown in FIG. 10, first carrier tape 900A presses on abutting section 31a of stopper member 31 such that stopper member 31 rotates against the biasing force of spring 36. By this, stopping section 31 of stopper member 31 contacts the upper surface of first carrier tape 900A.

In that state, as described above, operation lever 51 is rotated (second sensor 83 turns on), and the leading end of second carrier tape 900B is inserted through tape insertion section 21d between first carrier tape 900A and entrance retaining member 32. When this is done, the leading end of second carrier tape 900B contacts stopping section 31c of stopper member 31 and second carrier tape 900B is stopped at that position.

By this, feeding downstream of second carrier tape 900B is prevented and second carrier tape 900B stands by at that position. When second carrier tape 900B has been inserted to a position contacting stopping section 31c of stopper member 31, because third dog 86 is operated by second carrier tape 900B, the insertion of second carrier tape 900B is detected by third sensor 85.

After the insertion of second carrier tape 900B, when operation of operation lever 51 is released, operation lever 51 returns to its original position, but because first carrier tape 900A is pressed against abutting section 31a of stopper member 31, second carrier tape 900B remains in a stopped state due to stopping section 31c of stopper member 31. Note that, even if second carrier tape 900B is inserted into tape insertion section 21d without rotating operation lever 51, the insertion of second carrier tape 900B is prevented by obstructing plate 56 that contacts the upper surface of first carrier tape 900A (refer to FIG. 10).

When the trailing end of first carrier tape 900A is fed downstream further than the leading end of second carrier tape 900B, engaging holes 901b formed in second carrier tape 900B engage with engaging protrusions 64a of fourth sprocket 64. Then, second carrier tape 900B progresses into the gap between tape feeding path 38 and stopper member 31 created by first carrier tape 900A, and is fed towards second sprocket 62. Note that, when the leading end of second carrier tape 900B pushes up abutting section 31a, as described above, stopper member 31 is again rotated against the biasing force of spring 36, such that insertion of a new carrier tape 900 is prevented by stopper member 31.

Here, in a case in which a tape blockage of carrier tape 900 occurs between second sprocket 62 and third sprocket 63 during operation of feeder 21, the following measures are performed. As shown in FIG. 6, an operator releases locking member 115 and rotates cover member 110 upwards around axis section 114 along with biasing member 29, so as to reveal tape feeding path 38 between second sprocket 62 and third sprocket 63. Then, the tape blockage is cleared by lifting upper surface retaining member 28 and removing carrier tape 900.

Figure 11:
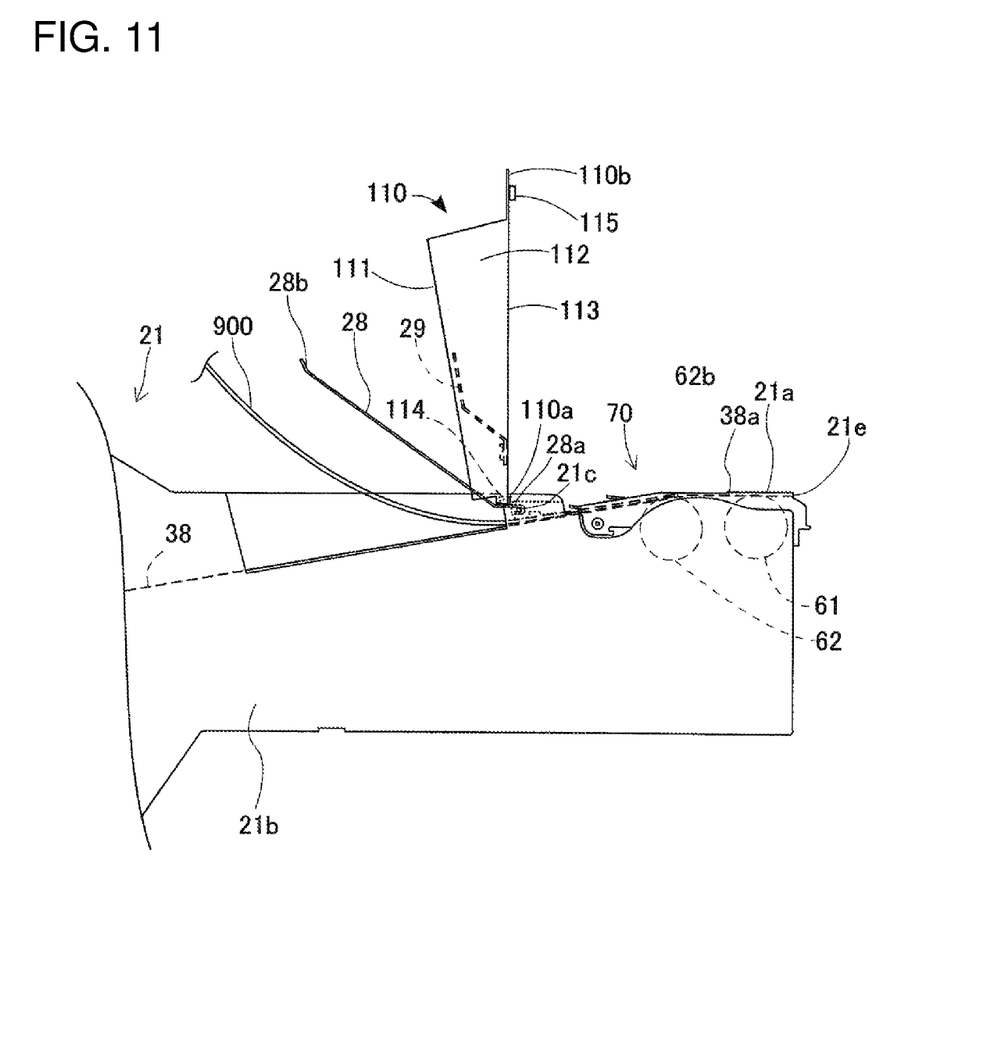
FIG. 11 is a side view showing a state with the tape inserted and a cover member of the feeder open.

Also, when feeding carrier tape 900 of a length too short to be conveyed from reels 810 and 820, the following measures are performed. An operator performs the same operation as above to reveal tape feeding path 38 between second sprocket 62 and third sprocket 63. Then, as shown in FIG. 11, the operator lifts up upper surface retaining member 28, inserts carrier tape 900 that is too short, engages engaging protrusions 62a of second sprocket 62 with engaging holes 901b of the carrier tape 900 and feeds the carrier tape 900.

Effects

Feeder 21 of the above embodiment is provided with: feeder main body 21b, on a rear section of which is formed tape insertion section 21d for inserting carrier tape 900 that stores multiple components and on a front section of which is formed tape discharge section 21e for discharging carrier tape 900 from which components have been removed; and tape feeding path 38 for feeding carrier tape 900 from rear to front, tape feeding path 38 being provided on feeder main body 21b between side walls 21ba and 21bb so as to connect to tape insertion section 21d and tape discharge section 21e.

Further provided are: rear-side sprockets 63 and 64 for feeding carrier tape along tape feeding path 38, the rear-side sprockets 63 and 64 being rotatably provided on feeder main body 21b and including engaging protrusions 63a and 64a capable of engaging with engaging holes 901b of carrier tape 900 inserted into tape insertion section 21d; front-side sprockets 61 and 62 for feeding carrier tape 900 to tape discharge section 21e, front-side sprockets 61 and 62 being rotatably provided on feeder main body 21b and including engaging protrusions 61a and 62a capable of engaging with engaging holes 901b of carrier tape 900 fed by rear-side sprockets 63 and 64; and cover member 110 provided on feeder main body 21b in an openable and closable manner so as to cover tape feeding path 38 between rear-side sprockets 63 and 64 and front-side sprockets 61 and 62.

Because cover member 110 is provided between rear-side sprockets 63 and 64 and front-side sprockets 61 and 62 of feeder main body 21b in a manner capable of revealing tape feeding path 38, if a tape blockage occurs along tape feeding path 38, an operator can easily clear the tape blockage by opening cover member 110. By this, unlike with conventional technology, it is not necessary for an operator to remove feeder 21 from component mounter 100 and disassemble feeder main body 21b, thus lowering of production efficiency is curtailed.

Also, cover member 110 is formed so as to cover an upper portion of tape feeding path 38 and side wall 21bb of feeder main body 21b formed to be lower than side wall 21ba of feeder main body 21b that is formed protruding higher than tape feeding path 38. Further, because end section 110a of cover member 110 in the feeding direction is rotatably supported on side wall 21ba, an operator can widely reveal tape feeding path 38, making work of clearing a tape blockage easy.

Also, upper surface retaining member 28 that presses on an upper surface of carrier tape 900 fed along tape feeding path 38 covered by cover member 110. By this, an operator is able to reliably align carrier tape 900 with tape feeding path 38 by pressing carrier tape 900 for which the blockage was cleared with upper surface retaining member 28 at tape feeding path 38.

Also, because retainer biasing member 29 that biases upper surface retaining member 28 is provided on cover member 110, when cover member 110 is opened, biasing member 29 is separated from upper surface retaining member 28 along with cover member 110. Thus, an operator can easily place carrier tape 900 for which a tape blockage has been cleared on tape feeding path 38.

Others

In the other above, as shown in FIG. 5, cover member 110 is formed in an L-shape as viewed along line 4-4, but the configuration may be such that both side walls 21ba and 21bb of feeder main body 21b are formed at the same height, such that cover member 110 is formed in a U-shape as viewed along line 4-4 so that both sides of tape feeding path 38 can be opened. Also, the configuration may be such that both side walls 21ba and 21bb of feeder main body 21b protrude above tape feeding path 38, such that cover member 110 forms a rectangle as viewed along line 4-4 so that an upper portion of tape feeding path 38 can be opened.

Also, cover member 110 is configured such that front side end 110a is rotatably supported on axis section 114, and rear end section 110b is locked on feeder main body 21b in a releasable manner by locking member 115, but front side end 110a may be locked on feeder main body 21b in a releasable manner by locking member 115, and rear end section 110b may be rotatably supported on axis section 114. Also, cover member 110 is configured to open and close at the front-rear, but may be configured to open and close at the left or right (side wall 21ba or 21bb). Further, biasing member 29 is configured from a torsion spring, but may be configured from an items with elasticity such as a coil spring, runner material, or air damper.

The disclosure is not limited to the configuration described in the embodiments described above, and various embodiments may be adopted within a scope that does not depart from the gist of the present disclosure described in the claims.

REFERENCE SIGNS LIST

21: feeder; 21b: feeder main body; 21ba, 21bb: side wall; 21d: tape insertion section; 21e: tape discharge section; 38:

tape feeding path; 61: first sprocket; 62: second sprocket; 63: third sprocket; 64: fourth sprocket; 651*a*, 62*a*, 63*a*, 64*a*: engaging protrusion; 28: upper surface retaining member; 29: biasing member; 100: component mounter; 110: cover member; 900: carrier tape; 901*b*: engaging hole □

The invention claimed is:

1. A feeder comprising:
   a feeder main body, on a rear section of which is formed a tape insertion section for inserting a carrier tape that stores multiple components, and on a front section of which is formed a tape discharge section for discharging the carrier tape from which the components have been removed;
   a tape feeding path for feeding the carrier tape from rear to front, the tape feeding path extends in a feeding direction on the feeder main body so as to connect to the tape insertion section;
   a rear-side sprocket rotatably provided on the feeder main body and including an engaging protrusion configured to engaging engaging holes of the carrier tape inserted into the tape insertion section, the rear-side sprocket being configured to feed the carrier tape along the tape feeding path;
   a front-side sprocket rotatably provided on the feeder main body and including an engaging protrusion configured to of engaging engaging holes of the carrier tape fed by the rear-side sprocket, the front-side sprocket being configured to feed the carrier tape to the tape discharge section; and
   a cover member provided on the feeder main body in an openable and closable manner so as to cover the tape feeding path between the rear-side sprocket and the front-side sprocket,
   wherein the cover member includes an end that is rotatably supported on a first side wall of the feeder main body, an upper surface that extends from the end in the feeding direction to cover an upper portion of the tape feeding path, and a side surface that extends from the end in the feeding direction and that extends downward from the upper surface to cover a second side wall of the feeder main body that is formed opposite to and lower than the first side wall, the first side wall protruding higher than the tape feeding path.

2. The feeder according to claim 1, further comprising:
   an upper surface retaining member on the feeder main body configured to press on an upper surface of the carrier tape being fed on the tape feeding path covered by the cover member.

3. The feeder according to claim 2, wherein
   the cover member includes a retainer biasing member configured to bias the upper surface retaining member downwards toward the tape feeding path.

4. The feeder according to claim 3, wherein
   the retaining biasing member is connected to a bottom side of the upper surface of the cover member and the retaining biasing member is configured to separate from the upper surface retaining member when the cover member is opened to an open state.

* * * * *

UNITED STATES PATENT AND TRADEMARK OFFICE
CERTIFICATE OF CORRECTION

PATENT NO. : 10,426,069 B2
APPLICATION NO. : 15/556666
DATED : September 24, 2019
INVENTOR(S) : Hiroyasu Ohashi et al.

It is certified that error appears in the above-identified patent and that said Letters Patent is hereby corrected as shown below:

On the Title Page

Item (72), the 2nd Inventor's information is incorrect. Item (72) should read:
--(72) Inventors: Hiroyasu Ohashi, Nagoya (JP);
                Hiroki Murase, Okazaki (JP)--

Signed and Sealed this
Twenty-sixth Day of November, 2019

Andrei Iancu
*Director of the United States Patent and Trademark Office*